United States Patent
Huang et al.

(10) Patent No.: US 9,510,449 B2
(45) Date of Patent: Nov. 29, 2016

(54) MULTI-LAYER PRINTED CIRCUIT BOARD AND METHOD FOR FABRICATING MULTI-LAYER PRINTED CIRCUIT BOARD

(71) Applicant: Huawei Technologies Co., Ltd., Shenzhen (CN)

(72) Inventors: Mingli Huang, Shenzhen (CN); Tao Feng, Shanghai (CN); Songlin Li, Shenzhen (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 0 days.

(21) Appl. No.: 14/457,433

(22) Filed: Aug. 12, 2014

(65) Prior Publication Data

US 2014/0345932 A1 Nov. 27, 2014

Related U.S. Application Data

(63) Continuation of application No. PCT/CN2012/086516, filed on Dec. 13, 2012.

(30) Foreign Application Priority Data

Mar. 13, 2012 (CN) .......................... 2012 1 0064742

(51) Int. Cl.
*H05K 1/11* (2006.01)
*H05K 3/40* (2006.01)
(Continued)

(52) U.S. Cl.
CPC ............... *H05K 1/115* (2013.01); *H05K 1/144* (2013.01); *H05K 3/4046* (2013.01);
(Continued)

(58) Field of Classification Search
CPC .... B81C 1/0023; H01G 4/40; H05K 1/0251; H05K 1/115; H05K 1/144; H05K 1/165; H05K 1/185; H05K 1/186; H05K 1/0272; H05K 3/064; H05K 3/243; H05K 3/321; H05K 3/386; H05K 3/423; H05K 3/462; H05K 3/4046; H05K 3/4614; H05K 3/4617; H05K 3/4647; H05K 3/4652; H05K 3/4658; H05K 3/4679; H05K 3/4697; H05K 2201/086; H05K 2201/0195; H05K 2201/0394; H05K 2201/0355; H05K 2201/09063; H05K 2201/09781; H05K 2201/10015; H05K 2201/10242; H05K 2203/063; H05K 2203/135; H05K 2203/167; H05K 2203/0733; H01L 21/486; H01L 23/49827; H01L 2924/0002; Y10T 29/49165; Y10T 29/49155; Y10T 29/49213; Y02P 70/611

USPC .................. 29/846, 852, 879; 156/281, 293; 174/266, 261, 250; 361/173, 820
See application file for complete search history.

(56) References Cited

U.S. PATENT DOCUMENTS 3,577,276 A * 5/1971 Edge ........................ C23C 18/28
106/1.22

(Continued)

FOREIGN PATENT DOCUMENTS

| CN | 1104404 A | 6/1995 |
|----|-----------|--------|
| CN | 1454044 A | 11/2003 |

(Continued)

OTHER PUBLICATIONS

Foreign Communication From a Counterpart Application, Chinese Application No. 201210064742.1, Chinese Office Action dated Sep. 9, 2013, 6 pages.

(Continued)

*Primary Examiner* — Timothy Thompson
*Assistant Examiner* — Guillermo Egoavil
(74) *Attorney, Agent, or Firm* — Conley Rose P.C.

(57) ABSTRACT

Embodiments of the present disclosure relate to the field of electronics and, in particular, to a multi-layer printed circuit board and a method for fabricating the same. The circuit board is able to avoid the problem that signal transmission performance is affected by a plated hole. The multi-layer printed circuit board includes at least two layers of core plates that are adhered, where a circuit mechanical part is disposed on the core plates, a via is also provided on the core plates, and a metal column is embedded in the via, where one end of the metal column is connected to a corresponding position on an antenna feeder circuit mechanical part disposed on the core plate, and the other end is connected to a corresponding position on an antenna feeder circuit mechanical part disposed on an adjacent layer of the core plate. The method is used for fabricating a multi-layer printed circuit board.

2 Claims, 5 Drawing Sheets

(51) Int. Cl.
*H05K 1/14* (2006.01)
*H05K 3/46* (2006.01)
*H05K 1/02* (2006.01)

(52) U.S. Cl.
CPC ......... *H05K 3/4623* (2013.01); *H05K 1/0251* (2013.01); *H05K 3/4617* (2013.01); *H05K 3/4647* (2013.01); *H05K 2201/10242* (2013.01)

(56) References Cited

U.S. PATENT DOCUMENTS

| | | | | |
|---|---|---|---|---|
| 5,290,970 | A | * | 3/1994 | Currie ................... H05K 3/225 174/250 |
| 5,517,751 | A | | 5/1996 | Bross et al. |
| 5,822,850 | A | | 10/1998 | Odaira et al. |
| 5,876,789 | A | | 3/1999 | Nakada |
| 2002/0027531 | A1 | * | 3/2002 | Brown ............. G06K 19/07749 343/895 |
| 2003/0043554 | A1 | * | 3/2003 | Seymour ............. G01R 1/0408 361/760 |
| 2003/0196833 | A1 | * | 10/2003 | Fujii ....................... H05K 3/462 174/261 |
| 2006/0272850 | A1 | | 12/2006 | Morimoto et al. |
| 2008/0089043 | A1 | * | 4/2008 | Hirano .................... H01G 4/40 361/763 |
| 2009/0175022 | A1 | * | 7/2009 | Kwon .................. H01L 21/486 361/820 |
| 2009/0269954 | A1 | * | 10/2009 | Loch .................. H01R 13/6666 439/108 |

FOREIGN PATENT DOCUMENTS

| | | |
|---|---|---|
| CN | 1538802 A | 10/2004 |
| CN | 1946267 A | 4/2007 |
| CN | 101211932 A | 7/2008 |
| CN | 101567356 A | 10/2009 |
| CN | 102006733 A | 4/2011 |
| CN | 102595778 A | 7/2012 |
| EP | 0564019 A2 | 8/1993 |

OTHER PUBLICATIONS

Foreign Communication From a Counterpart Application, European Application No. 12871458.1, Extended European Search Report dated Jan. 10, 2014, 7 pages.
Foreign Communication From a Counterpart Application, PCT Application No. PCT/CN2012/086516, English Translation of International Search Report dated Mar. 14, 2013, 3 pages.
Foreign Communication From a Counterpart Application, PCT Application No. PCT/CN2012/086516, English Translation of Written Opinion dated Mar. 14, 2013, 10 pages.

* cited by examiner

MULTI-LAYER PRINTED CIRCUIT BOARD AND METHOD FOR FABRICATING MULTI-LAYER PRINTED CIRCUIT BOARD

CROSS-REFERENCE TO RELATED APPLICATIONS

This application is a continuation of International Application No. PCT/CN2012/086516, filed on Dec. 13, 2012, which claims priority to Chinese Patent Application No. 201210064742.1, filed on Mar. 13, 2012, both of which are hereby incorporated by reference in their entireties.

TECHNICAL FIELD

The present disclosure relates to the field of electronics, and in particular, to a multi-layer printed circuit board and a method for fabricating a multi-layer printed circuit board.

BACKGROUND

Currently, a conventional printed circuit board fabrication technique is commonly used to fabricate an antenna feeder PCB (Printed Circuit Board, printed circuit board), and in particular, a conventional polytetrafluorethylene (PTFE) printed circuit board is used.

Conductor roughness of a transmission path in an antenna feeder circuit is one of major factors affecting passive inter-modulation (PIM) of an antenna. Therefore, transmission lines at internal and external layers both use copper foil of low roughness to improve PIM. A transmission line at an internal layer of a conventional multi-layer PTFE board is connected to a surface layer through a plated hole, and a current is transmitted in a direction along an interior wall of the plated hole. However, roughness of the wall of the plated hole affects PIM performance of the antenna feeder circuit.

On the one hand, a plated hole fabrication technique inevitably brings about a problem such as a rough hole and copper infiltration, which greatly affects PIM performance. On the other hand, a surplus wall of the plated hole also affects signal matching. To solve the foregoing problems, the prior art provides a method for connecting a line at an internal layer and a line at an external layer by means of welding. However, in this method, solder is used and occupies a large amount of space. In addition, this method is not suitable for mass production because of low welding efficiency.

SUMMARY

Embodiments of the present disclosure provide a multi-layer printed circuit board and a method for fabricating a multi-layer printed circuit board, which can avoid a problem that signal transmission performance is affected by a plated hole.

To achieve the foregoing objective, the embodiments of the present disclosure adopt the following technical solutions.

According to one aspect, a multi-layer printed circuit board includes at least two core plates adhered together, a circuit mechanical part disposed over each of the core plates, a via extending through each of the core plates, and a metal column embedded in the via of each of the core plates. A first end of the metal column in the core plate of an adjacent layer is connected to the circuit mechanical part disposed over the core plate of a current layer and a second end of the metal column in the adjacent layer is connected to the circuit mechanical part disposed over the core plate of the adjacent layer.

According to one aspect, a method for fabricating a multi-layer printed circuit board. The method includes providing core plates, each of the core plates having via extending through the core plate and a circuit mechanical part disposed over the core plate, inserting a metal column into the via the core plates, and laminating the core plates together such that a first end of the metal column in the core plate of an adjacent layer is connected to the circuit mechanical part disposed over the core plate of a current layer and a second end of the metal column in the adjacent layer is connected to the circuit mechanical part disposed over the core plate of the adjacent layer.

According to one aspect, a method for fabricating a multi-layer printed circuit board. The method includes forming a metal column on a first circuit mechanical part of a core plate at a current layer, the metal column used to connect to a second circuit mechanical part of a core plate at an adjacent layer and perpendicular to the first circuit mechanical part, providing a via around the metal column, and laminating the core plate at the current layer and the core plate at the adjacent layer together.

In the multi-layer printed circuit board and the method for fabricating a multi-layer printed circuit board provided by the embodiments of the present disclosure, a metal column is used to connect circuit mechanical parts of adjacent core plates. In comparison with the prior art in which circuit mechanical parts of adjacent core plates are connected through a plated hole, a problem that signal transmission performance is affected by a rough wall of the plated hole or the like is avoided.

BRIEF DESCRIPTION OF DRAWINGS

To describe the technical solutions in the embodiments of the present disclosure or in the prior art more clearly, the following briefly introduces the accompanying drawings required for describing the embodiments or the prior art. Apparently, the accompanying drawings in the following description show merely some embodiments of the present disclosure, and a person of ordinary skill in the art may still derive other drawings from these accompanying drawings without creative efforts.

DESCRIPTION OF EMBODIMENTS

The following clearly describes the technical solutions in the embodiments of the present disclosure with reference to the accompanying drawings in the embodiments of the present disclosure. Apparently, the described embodiments are merely a part rather than all of the embodiments of the present disclosure. All other embodiments obtained by a person of ordinary skill in the art based on the embodiments of the present disclosure without creative efforts shall fall within the protection scope of the present disclosure.

Figure 1:
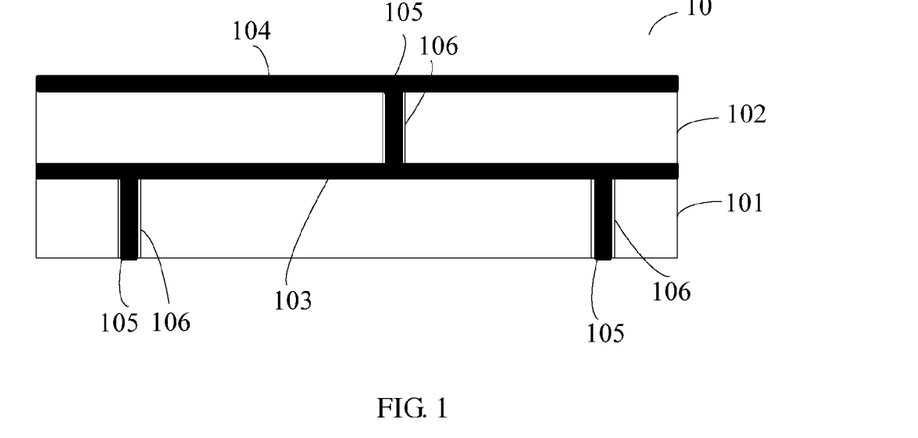
FIG. 1 and FIG. 9 are schematic structural diagrams of an antenna feeder printed circuit board according to various embodiments of the present disclosure.

An embodiment of the present disclosure provides a multi-layer printed circuit board 10. As shown in FIG. 1, the multi-layer printed circuit board 10 includes at least two layers of core plates that are adhered, which are a core plate 101 and a core plate 102 in this embodiment. A first circuit mechanical part 103 is disposed on the core plate 101 of a current layer and a second circuit mechanical part 104 is disposed on the core plate 102 of an adjacent layer. A via 106 is provided through the core plate 101 and the core plate 102. The multi-layer printed circuit board 10 further includes a metal column 105 embedded in the via 106. One end of the metal column 105 is connected to the first circuit mechanical part 103 disposed on the core plate 101 at the current layer, and the other end of the metal column 105 is connected to the second circuit mechanical part 104 disposed on the core plate 102 at the adjacent layer. In this way, a transmission line at an internal layer of a multi-layer board is connected by using a metal column. In comparison with the prior art in which a connection is performed through a plated hole, the problem of signal transmission performance being affected by a rough wall of a plated hole is avoided. In addition, the problem of signal matching being affected by a surplus wall of a plated hole is also avoided.

In some embodiments, a material of the metal column 105 may be copper, aluminum, or another metal material.

In some embodiments, a surface of the metal column 105 is disposed with a non-magnetic metal layer. By way of example, the non-magnetic metal may refer to a non-magnetic metal other than steel, nickel metal, and a part of stainless steel (a martensite or ferrite type, such as 404B, 430, 420, or 410). In some embodiments, the surface of the metal column 105 may be processed with a material such as gold, silver, or tin. In this way, conductive contact impedance can be effectively improved, and signal transmission is enhanced, thereby ensuring reliability of signal transmission.

Figure 9:
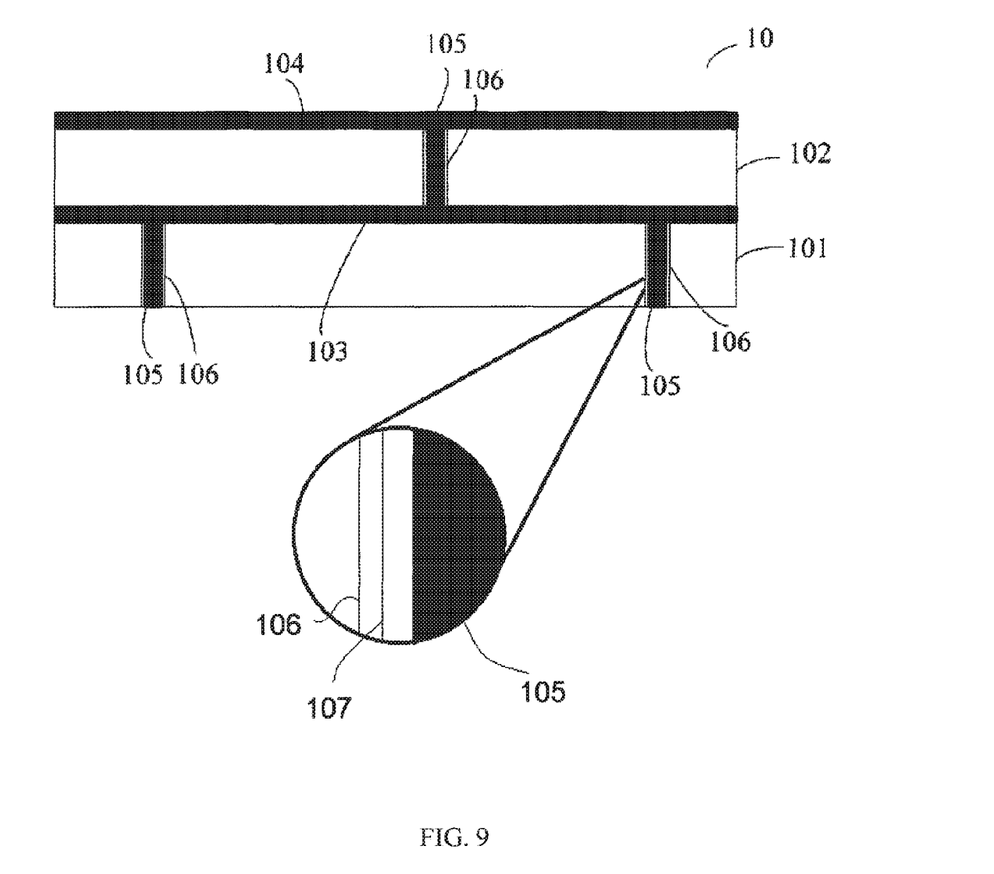

Preferably and as shown in FIG. 9, a surface of the metal column 105 in contact with the via 106 may be disposed with a medium protection layer 107. In some embodiments, the medium protection layer 107 is plastic, paint, or the like, so as to protect the metal column 105 from oxidization or corrosion in long-term use and further ensure reliability of signal transmission.

In the multi-layer printed circuit board provided by the embodiment of the present disclosure, a metal column is used to connect circuit mechanical parts of adjacent core plates. In comparison with the prior art in which circuit mechanical parts of adjacent core plates are connected through a plated hole, the problem of signal transmission performance being affected by a rough wall of a plated hole or the like is avoided.

Figure 2:
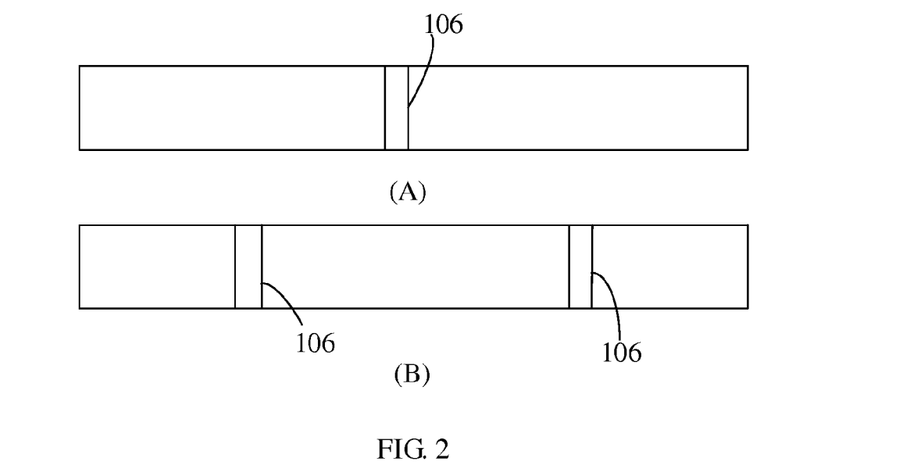
FIG. 2 to FIG. 4 are schematic structural diagrams of a process of a method for fabricating an antenna feeder printed circuit board according to an embodiment of the present disclosure.
Figure 3:
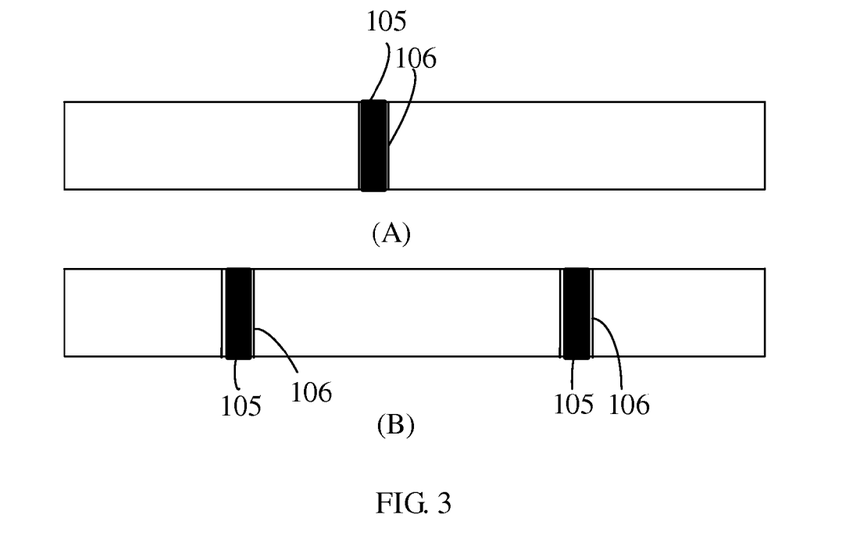
Figure 4:
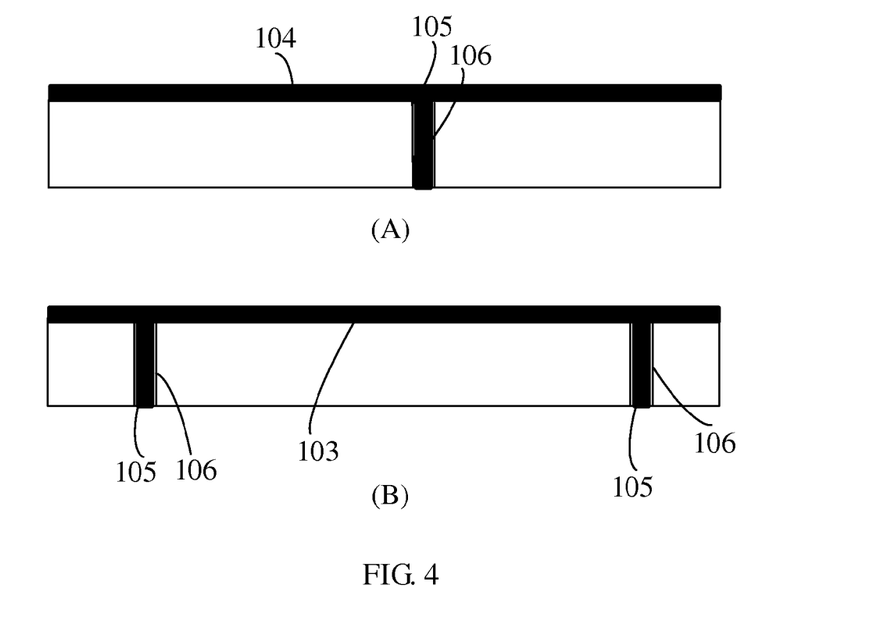

An embodiment of the present disclosure provides a method for fabricating a multi-layer printed circuit board. As shown in FIG. 2 to FIG. 4, the method includes the following steps:

S201: Form a via through a fabricated core plate or provide a core plate with a via extending therethrough.

Specifically, in the embodiment of the present disclosure, a via 106 is provided at a position where a first circuit mechanical part 103 of a core plate 101 at a current layer is connected to a second circuit mechanical part 104 of a core plate 102 at an adjacent layer. As shown in FIG. 2, (A) shows the core plate at the current layer, where one via 106 is provided on the core plate at the layer, and (B) shows the core plate at the adjacent layer, where two vias 106 are provided on the core plate at the adjacent layer. In some embodiments, the core plate may be a thermoplastic resin core plate. In some embodiments, the via 106 may be formed by hole drilling or hole milling.

S202: Press a fabricated metal column into the via. In some embodiments, the metal column may be inserted into the via or otherwise formed or disposed in the via.

In some embodiments, as shown in FIG. 3, a material of the metal column 105 may be copper, aluminum, or another metal material. Moreover, the metal column 105 may be formed by means of a die-casting or machining technique, where the die-casting technique is a method for casting and liquid die forging. A die-casting and die forging technique is a technique that is completed on a dedicated die-casting and die forging machine. A basic technique process of the die-casting and die forging technique is metal liquid is first cast and mold-filled into a cavity of a mold at a low or high speed. The mold has a movable cavity surface and the cavity surface is pressurized and forged in a cooling process of the metal liquid. As such, defects of shrinkage cavity and shrinkage porosity of a blank are eliminated and an internal structure of the blank obtains fragmented grains in a forging state. Comprehensive mechanical performance of the blank can be significantly improved. The machining is short for mechanical processing, and refers to a processing technique for precisely removing a material by using a processing machine.

In some embodiments, a surface of the metal column 105 is disposed with a non-magnetic metal layer. For example, the non-magnetic metal may refer to non-magnetic metal other than steel, nickel metal, and a part of stainless steel (a martensite or ferrite type such as 404B, 430, 420, or 410) metal. In some embodiments, the surface of the metal column 105 may be processed with a material such as gold, silver, or tin. In this way, conductive contact impedance can be effectively improved and signal transmission is enhanced, thereby ensuring reliability of signal transmission. The prior art may be used for disposing the non-magnetic metal layer on the surface of the metal column 105, which is not repeatedly described herein.

In some embodiments, a surface of the metal column 105 in contact with the via 106 is disposed with a medium protection layer. In some embodiments, the medium protection layer may be specifically plastic, paint, or the like. In some embodiments, a structure of the metal column is similar to that of a coaxial line.

It should be noted that the metal column 105 may be pressed or inserted into the via 106 manually or by using an automatic chip mounter. After the metal column 105 is pressed into the via 106, a certain holding force is used between the metal column 105 and the via 106 to prevent the metal column 105 from dropping off.

S203: Laminate core plates at various layers that are configured with a circuit mechanical part so that one end of the metal column is connected to a first circuit mechanical part disposed on a core plate at a current layer and the other end of the metal column is connected to a second circuit mechanical part disposed on a core plate at an adjacent layer.

In some embodiments, as shown in FIG. 4, the adjacent core plates 101 and 102 (FIG. 1) are laminated together to form the multi-layer printed circuit board shown in FIG. 1. The first circuit mechanical part 103 on the core plate 101 at the current layer is connected to the second circuit mechanical part 104 on the core plate 102 at the adjacent layer by using the metal column 105.

Further, the circuit mechanical parts that are formed on the core plates by, for example, etching or other suitable process may be formed before the metal column is pressed into the via 106 or may also be formed after the metal column is pressed into the via 106.

In some embodiments, the circuit mechanical parts may be antenna feeder circuit mechanical parts and are connected to adjacent antenna feeder circuit mechanical parts by using a metal column embedded in a core plate. In this way, a current between the adjacent antenna feeder circuit mechanical parts is transmitted in a direction along the metal column. In comparison with the prior art in which a current is transmitted in a direction along a plated hole, the problem of signal matching being affected by a rough wall of a plated hole is avoided, and PIM performance of an antenna feeder circuit is also improved.

In some embodiments, after fabrication according to the method provided by this embodiment, multiple layers of core plates need to be laminated. The multiple core plates may be first disposed, aligned in a manner such as by using dowels, and then laminated. In this way, a phenomenon of dislocation occurring at a position where a metal column is connected to a circuit mechanical part as a result of multi-layer lamination is prevented. In some embodiments, the multiple core plates that are disposed may be laminated by using a high-temperature press. The metal column is directly connected to circuits at another layer, and an external layer of a copper column can be directly welded or connected to another circuit by means of electroplating.

In the method for fabricating a multi-layer printed circuit board provided by the embodiment of the present disclosure, a metal column is used to connect circuit mechanical parts of adjacent core plates. In comparison with the prior art in which circuit mechanical parts of adjacent core plates are connected through a plated hole, the problem of signal transmission performance being affected by a rough wall of a plated hole or the like is avoided. In addition, the fabrication method is simple and suitable for mass production.

Figure 5:
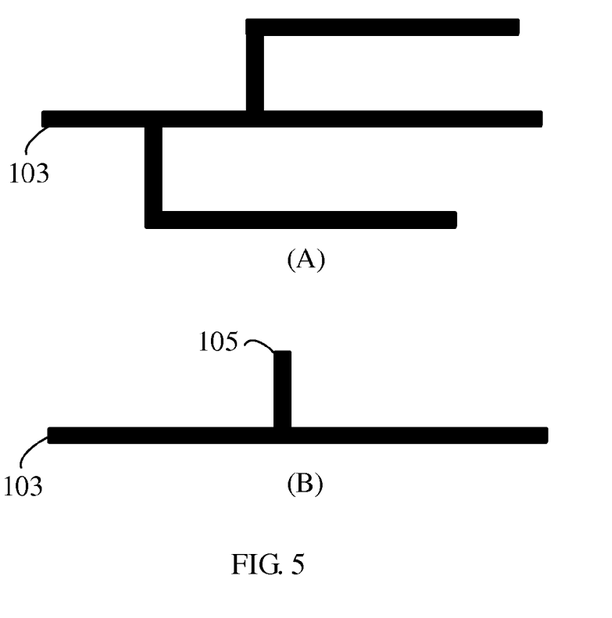
FIG. 5 to FIG. 8 are schematic structural diagrams of a process of another method for fabricating an antenna feeder printed circuit board according to an embodiment of the present disclosure.

An embodiment of the present disclosure provides a method for fabricating a multi-layer printed circuit board. As shown in FIG. 5 to FIG. 8, the method includes the following steps:

S501: Form a metal column 105 on a first circuit mechanical part 103 of a core plate 101 at a current layer. The metal column 105 is used to connect to a second circuit mechanical part 104 of a core plate 102 at an adjacent layer and is perpendicular to the first circuit mechanical part 103.

In some embodiments, a circuit mechanical part with a metal column may be fabricated by, for example, die stamping or laser cutting. In some embodiments, a material of the circuit mechanical part and a material of the metal column are copper, aluminum, or other metal. As shown in FIG. 5, a structural top view of a first circuit mechanical part 103 on a core plate 101 at a current layer is shown in FIG. 5(A) and a side view is shown in FIG. 5(B) where a metal column is marked with 105.

In some embodiments, a surface of the metal column 105 is disposed with a non-magnetic metal layer. For example, the non-magnetic metal may refer to non-magnetic metal other than steel, nickel metal, and a part of stainless steel (martensite or ferrite type such as 404B, 430, 420, and 410) metal. In some embodiments, the surface of the metal column 105 may be processed with a material such as gold, silver, or tin. In this way, conductive contact impedance can be effectively improved, and signal transmission is enhanced, thereby ensuring reliability of signal transmission. The prior art may be used for disposing the non-magnetic metal layer on the surface of the metal column 105, which is not repeatedly described herein.

In some embodiments, a surface of the metal column in contact with a via 106 is disposed with a medium protection layer. The medium protection layer may be, for example, plastic, paint, or the like. In some embodiments, a structure of the metal column 105 is similar to that of a coaxial line.

Figure 6:
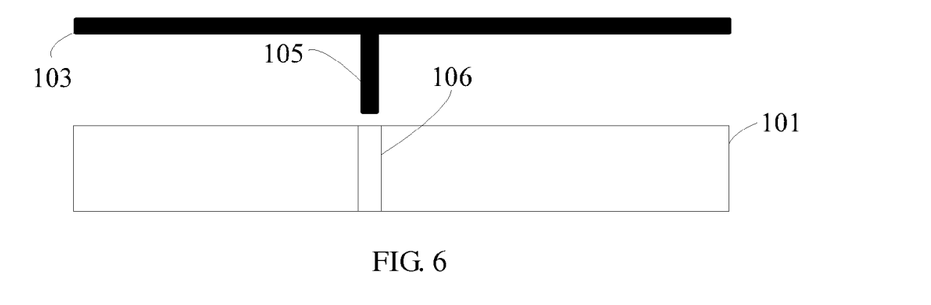
Figure 7:
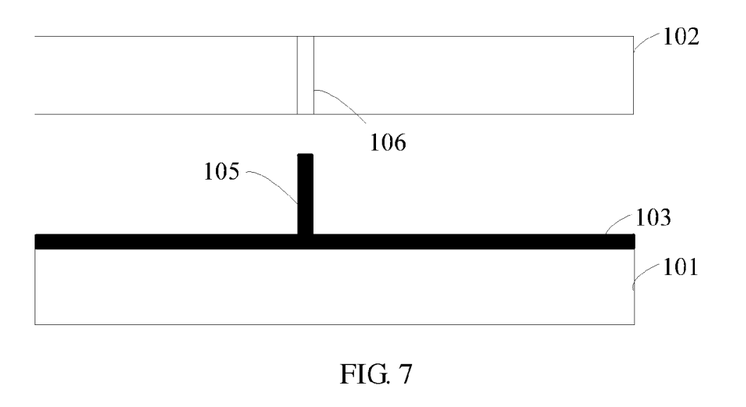

S502: If the metal column 105 points to the core plate 101 at the current layer, provide a via on the core plate 101 at the current layer; and/or, if the metal column 105 points to the core plate 102 at the adjacent layer, provide a via on the core plate 102 at the adjacent layer.

In some embodiments, if the metal column 105 on the first circuit mechanical part 103 points to the core plate 101 at the current layer, a via 106 is provided on the core plate 101 at the current layer, as shown in FIG. 6.

If the metal column 105 on the first circuit mechanical part 103 points to the core plate 102 at the adjacent layer, a via 106 is provided on the core plate 102 at the adjacent layer, as shown in FIG. 7.

Figure 8:
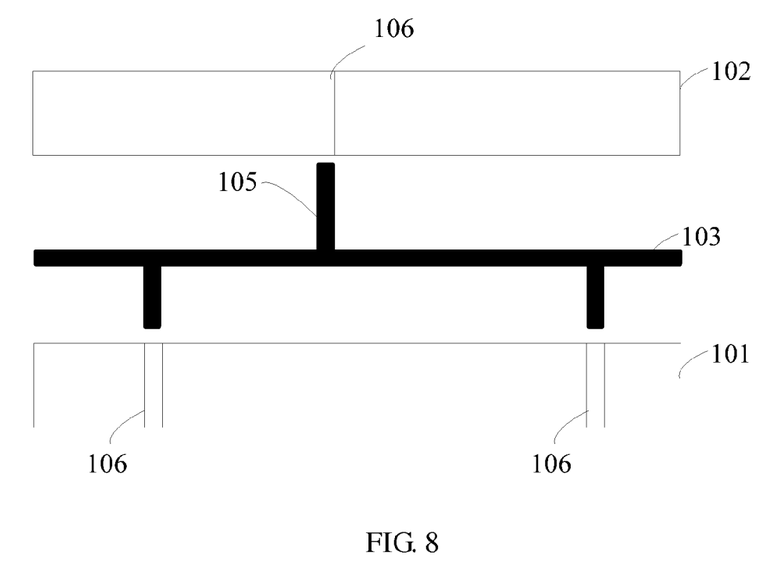

If a metal column 105 on the first circuit mechanical part 103 points to the core plate 102 at the adjacent layer, and another metal column 105 points to the core plate 101 at the current layer, a via 106 is provided on each of the core plate 102 at the adjacent layer and the core plate 101 at the current layer, as shown in FIG. 8.

In some embodiments, the core plate 101/102 may be a thermoplastic resin core plate and the via 106 may be made by hole drilling or hole milling.

S503: Laminate core plates 101/102 at various layers that are configured with a circuit mechanical part 103/104 so that one end of the metal column 105 is connected to the first circuit mechanical part 103 disposed on the core plate 101 at the current layer, and the other end of the metal column 105 is connected to the second circuit mechanical part 104 disposed on the core plate 102 at the adjacent layer.

In some embodiments, after the fabricated circuit mechanical parts 103/104 are disposed on the core plates 101/102, the core plates 101/102 at various layers are laminated together to form the multi-layer printed circuit board 10 shown in FIG. 1 where the metal column 105 is correspondingly pressed into the via 106 so that one end of the metal column 105 is connected to the first circuit mechanical part 103 disposed on the core plate 101 at the current layer and the other end of the metal column 105 is connected to the second circuit mechanical part 104 disposed on the core plate 102 at the adjacent layer.

In some embodiments, the circuit mechanical parts 103/104 may be antenna feeder circuit mechanical parts, and are connected to adjacent antenna feeder circuit mechanical parts by using a metal column 105 embedded in a core plate 101/102. In this way, a current between the adjacent antenna feeder circuit mechanical parts is transmitted in a direction along the metal column 105. In comparison with the prior art in which a current is transmitted in a direction along a plated hole, the problem of signal matching being affected by a rough wall of a plated hole is avoided, and PIM performance of an antenna feeder circuit is also improved.

In some embodiments, after fabrication according to the method provided by this embodiment, multiple layers of core plates 101/102 need to be laminated together. The multiple core plates 101/102 may be first disposed, aligned by using dowels, and then laminated. In this way, a phenomenon of dislocation occurring at a position where a metal column 105 is connected to a circuit mechanical part as a result of multi-layer lamination is prevented. In some embodiments, the multiple core plates 101/102 that are disposed may be laminated by using a high-temperature press. The metal column 105 is directly connected to a circuit at another layer and an external layer of a copper column can be directly welded or connected to another circuit by means of electroplating.

It should be noted that in a disposal process, a thin core plate 101/102 or a prepreg may be used to fill a height of a circuit mechanical part so that a metal column 105 is connected to the circuit mechanical part 103/104. In addition, resin may also be used to fill a gap between the metal column 105 and a via 106, thereby avoiding a phenomenon of dislocation occurring at a position where the metal column 105 is connected to the circuit mechanical part 103/104 in a subsequent fabrication process.

In the method for fabricating a multi-layer printed circuit board 10 provided by the embodiment of the present disclosure, a metal column 105 is used to connect circuit mechanical parts 103/104 of adjacent core plates 101/102. In comparison with the prior art in which circuit mechanical parts of adjacent core plates are connected through a plated hole, the problem of signal transmission performance being affected by a rough wall of a plated hole or the like is avoided. In addition, the fabrication method is simple and suitable for mass production.

A person of ordinary skill in the art may understand that all or a part of the processes of the methods in the embodiments may be implemented by a computer program instructing relevant hardware. The program may be stored in a computer readable storage medium. When the program runs, the processes of the methods in the embodiments may be included. The storage medium may be a magnetic disk, an optical disc, a read-only memory (ROM), a random access memory (RAM), or the like.

The foregoing descriptions are merely specific implementation manners of the present disclosure, but are not intended to limit the protection scope of the present disclosure. Any variation or replacement readily figured out by a person skilled in the art within the technical scope disclosed in the present disclosure shall fall within the protection scope of the present disclosure. Therefore, the protection scope of the present disclosure shall be subject to the protection scope of the claims.

What is claimed is:

1. A multi-layer printed circuit board, comprising:
   at least two core plates adhered together;
   an antenna feeder circuit mechanical part disposed over each of the core plates;
   a via extending through each of the core plates;
   a metal column embedded in the via of each of the core plates; and
   a non-magnetic metal layer disposed on a surface of the metal column,
   wherein a first end of the metal column in the core plate of an adjacent layer is connected to the antenna feeder circuit mechanical part disposed over the core plate of a current layer and a second end of the metal column in the adjacent layer is connected to the antenna feeder circuit mechanical part disposed over the core plate of the adjacent layer.

2. The multi-layer printed circuit board according to claim 1, wherein a surface of the metal column contacting the via is disposed with a medium protection layer.

* * * * *